Figure 2:
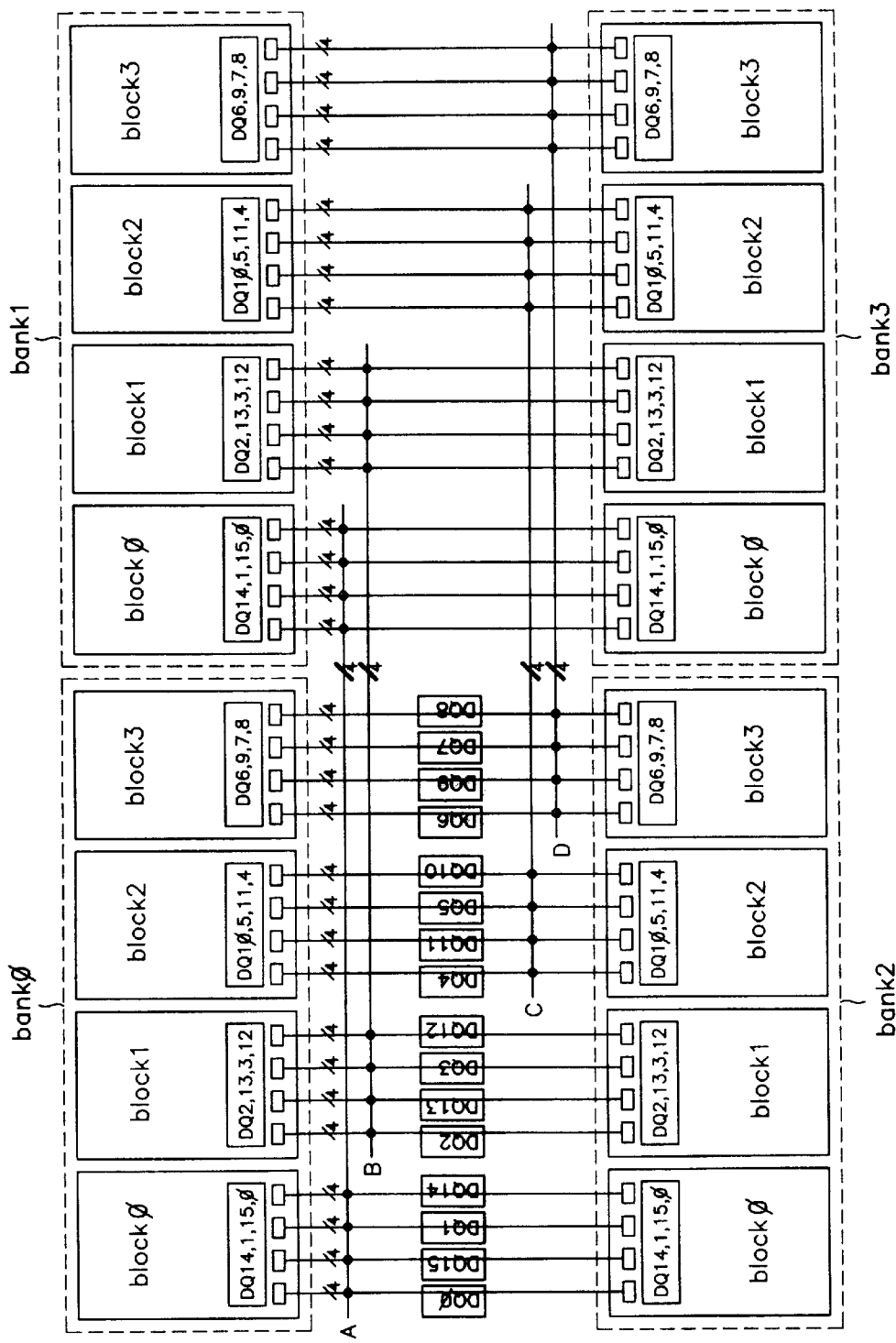

United States Patent
Kwean

[11] Patent Number: 6,072,744
[45] Date of Patent: Jun. 6, 2000

[54] MEMORY DEVICE HAVING DATA BUS LINES OF UNIFORM LENGTH

[75] Inventor: Ki Chang Kwean, Kyoungki-do, Rep. of Korea

[73] Assignee: Hyundai Electronics Industries Co., Ltd., Kyoungki-do, Rep. of Korea

[21] Appl. No.: 09/343,565

[22] Filed: Jun. 30, 1999

[30] Foreign Application Priority Data

Jul. 21, 1998 [KR] Rep. of Korea ............ 98-29314

[51] Int. Cl.[7] .................................................. G11C 8/00
[52] U.S. Cl. .................... 365/230.03; 365/51; 365/63
[58] Field of Search ................ 365/230.03, 230.06, 365/189.05, 189.08, 51, 63

[56] References Cited

U.S. PATENT DOCUMENTS

| | | | |
|---|---|---|---|
| 5,822,257 | 10/1998 | Ogawa | 365/200 |
| 5,838,627 | 11/1998 | Tomishima et al. | 365/230.03 |
| 5,867,439 | 2/1999 | Asakura et al. | 365/222 |

Primary Examiner—Richard T. Elms
Assistant Examiner—Hien Nguyen
Attorney, Agent, or Firm—Nath & Associates PLLC; Gary M. Nath; Gregory B. Kang

[57] ABSTRACT

A memory device comprises data bus lines whose lengths and widths are uniform. The memory device can minimize the lengths of the data bus lines and reduce the time delay, the skew between signals and the current consumption by uniformly disposing the data bus lines to each block in each bank, wherein each bank contains a plurality of blocks therein.

3 Claims, 3 Drawing Sheets

| | | | |
|---|---|---|---|
| Vcc | 1 | 50 | Vss |
| DQ0 | 2 | 49 | DQ15 |
| DQ1 | 3 | 48 | DQ14 |
| VssQ | 4 | 47 | VssQ |
| DQ2 | 5 | 46 | DQ13 |
| DQ3 | 6 | 45 | DQ12 |
| VccQ | 7 | 44 | VccQ |
| DQ4 | 8 | 43 | DQ11 |
| DQ5 | 9 | 42 | DQ10 |
| VssQ | 10 | 41 | VssQ |
| DQ6 | 11 | 40 | DQ9 |
| DQ7 | 12 | 39 | DQ8 |
| VccQ | 13 | 38 | VccQ |
| DQML | 14 | 37 | NC/RFU |
| WE# | 15 | 36 | DQMH |
| CAS# | 16 | 35 | CLK |
| RAS# | 17 | 34 | CLKE |
| CS# | 18 | 33 | NC |
| A11 | 19 | 32 | A9 |
| A10 | 20 | 31 | A8 |
| A0 | 21 | 30 | A7 |
| A1 | 22 | 29 | A6 |
| A2 | 23 | 28 | A5 |
| A3 | 24 | 27 | A4 |
| Vcc | 25 | 26 | Vss |

Fig. 1
(Prior Art)

MEMORY DEVICE HAVING DATA BUS LINES OF UNIFORM LENGTH

FIELD OF THE INVENTION

The present invention relates to data bus lines of a memory device having a plurality of banks and, more particularly, to a memory device having data bus lines whose lengths and widths are uniform.

DESCRIPTION OF THE PRIOR ART

In a memory device, a data bus line represents a line delivering data which is sensed from a memory cell and amplified into a high or low level. The data bus line significantly affects a data input/output operation since it is connected to a data (DQ) buffer.

Therefore, data bus lines in the memory device preferably have identical lengths and widths. If the lengths and widths of the data bus lines are not identical to each other, a different timing can occur in the data input/output operation due to a different timing delay between data. Also, in the worst case scenario, if an internal control signal is activated in response to the fastest signal, the input/output operation of the slowest signal may not be permitted.

Since, however, data bus lines used in a conventional memory device are generally disposed throughout the memory device, it is inevitable for the data bus lines to have long lengths.

For this reason, the data being delivered is delayed, and thus current consumption is also great.

Furthermore, a skew of the data being delivered may be great since the data bus lines have different lengths from each other.

SUMMARY OF THE INVENTION

It is an objective of the present invention to provide data bus lines whose lengths and widths are identical to each other.

In accordance with the present invention, there is provided a memory device which contains a first to a fourth bank, each bank having a first to a fourth block, and a first to a fourth set of data bus lines delivering data from each block in each of the banks to output data pins. In the memory device, the second bank is disposed in the right side of the first bank; the third bank is disposed below the first bank; and the fourth bank is disposed below the second bank.

A first group of internal data pads DQ0, DQ15, DQ1 and DQ14 is positioned between the first block of the first bank and the first block of the third bank; a second group of internal data pads DQ2, DQ13, DQ3 and DQ12 is disposed between the second block of the first bank and the second block of the third bank; a third group of internal data pads DQ4, DQ11, DQ5 and DQ10 is located between the third block of the first bank and the third block of the third bank; and a fourth group of internal data pads DQ6, DQ9, DQ7 and DQ8 is disposed between the fourth block of the first bank and the fourth block of the third bank.

The first set of data bus lines is arranged to share data input/output to/from the first block of the first bank, the first block of the second bank, the first block of the third bank and the first block of the fourth bank.

The second set of data bus lines is arranged to share data input/output to/from the second block of the first bank, the second block of the second bank, the second block of the third bank and the second block of the fourth bank.

The third set of data bus lines is arranged to share data input/output to/from the third block of the first bank, the third block of the second bank, the third block of the third bank and the third block of the fourth bank.

The fourth set of data bus lines is arranged to share data input/output to/from the fourth block of the first bank, the fourth block of the second bank, the fourth block of the third bank and the fourth block of the fourth bank.

The first to the fourth sets of data bus lines are located between the first and second banks and the third and fourth banks.

The numbers of pads contained in the first to the fourth groups of internal data pads are identical to each other.

BRIEF DESCRIPTION OF THE DRAWINGS

The foregoing and other objectives, features and advantages of the present invention will become apparent from the following detailed description of preferred embodiments of the invention with reference to the accompanying drawings in which:

FIG. 1 shows a conventional package pin configuration of 64M/128M SDRAMs;

FIG. 2 represents a block diagram of a first embodiment of the present invention; and FIG. 3 describes a block diagram of a second embodiment of the present invention.

DETAILED DESCRIPTION OF THE PREFERRED EMBODIMENTS

Hereinafter, the preferred embodiments of the present invention will be explained with reference to the drawings.

Referring to FIG. 1, a conventional package pin configuration of 64M/128M SDRAMs is illustrated.

As shown in FIG. 1, data (DQ) pins are located on a upper region of a package. This means that the DQ pads are inclined to one side within the memory device.

In FIG. 2, internal portions of the memory device having the DQ pads disposed as explained above.

Referring to FIG. 2, the first embodiment of the present invention is illustrated having data bus lines whose lengths and widths are identical.

As shown in FIG. 2, the memory device includes 4 banks, each bank having 4 blocks, but it is possible to change the numbers of banks and blocks, respectively.

The first embodiment of the present invention will be described hereinafter.

In FIG. 2, each bank having an identical configuration contains 4 blocks. Each block has 4 DQ pads assigned thereto.

That is to say, the first bank, BANK 0, includes the first to the fourth blocks, BLOCK 0, BLOCK 1, BLOCK 2 and BLOCK 3. The second bank, BANK 1, has the first to the fourth blocks, BLOCK 0, BLOCK 1, BLOCK 2 and BLOCK 3. The third bank, BANK 2, contains the first to the fourth blocks, BLOCK 0, BLOCK 1, BLOCK 2 and BLOCK 3. The fourth bank, BANK 3, employs the first to the fourth blocks, BLOCK 0, BLOCK 1, BLOCK 2 and BLOCK 3.

In FIG. 2, each of the letters A, B, C and D represents a set of data bus lines.

Among them, the set A of data bus lines shares data input/output to/from the first block, BLOCK 0, of the first bank, BANK 0, the first block, BLOCK 0, of the second bank, BANK 1, the first block, BLOCK 0, of the third bank, BANK 2, and the first block, BLOCK 0, of the fourth bank, BANK 3.

The set B of data bus lines shares data input/output to/from the second block, BLOCK 1, of the first bank, BANK 0, the second block, BLOCK 1, of the second bank, BANK 1, the second block, BLOCK 1, of the third bank, BANK 2, and the second block, BLOCK 1, of the fourth bank, BANK 3.

The set C of data bus lines shares data input/output to/from the third block, BLOCK 2, of the first bank, BANK 0, the third block, BLOCK 2, of the second bank, BANK 1, the third block, BLOCK 2, of the third bank, BANK 2, and the third block, BLOCK 2, of the fourth bank, BANK 3.

The set D of data bus lines shares data input/output to/from the fourth block, BLOCK 3, of the first bank, BANK 0, the fourth block, BLOCK 3, of the second bank, BANK 1, the fourth block, BLOCK 3, of the third bank, BANK 2, and the fourth block, BLOCK 3, of the fourth bank, BANK 3.

As can be seen in FIG. 2, the data bus lines are disposed in a straight line, and the order of data input/output to/from each block is identical to that of the data pins disposed as shown in FIG. 1.

An important point in the disposition of the above data bus lines is to constantly maintain the number of data input/output to/from each block for all of the banks. In this embodiment, after equally applying the block disposition to all of the banks, each bank is simply shifted to be disposed.

Figure 3:
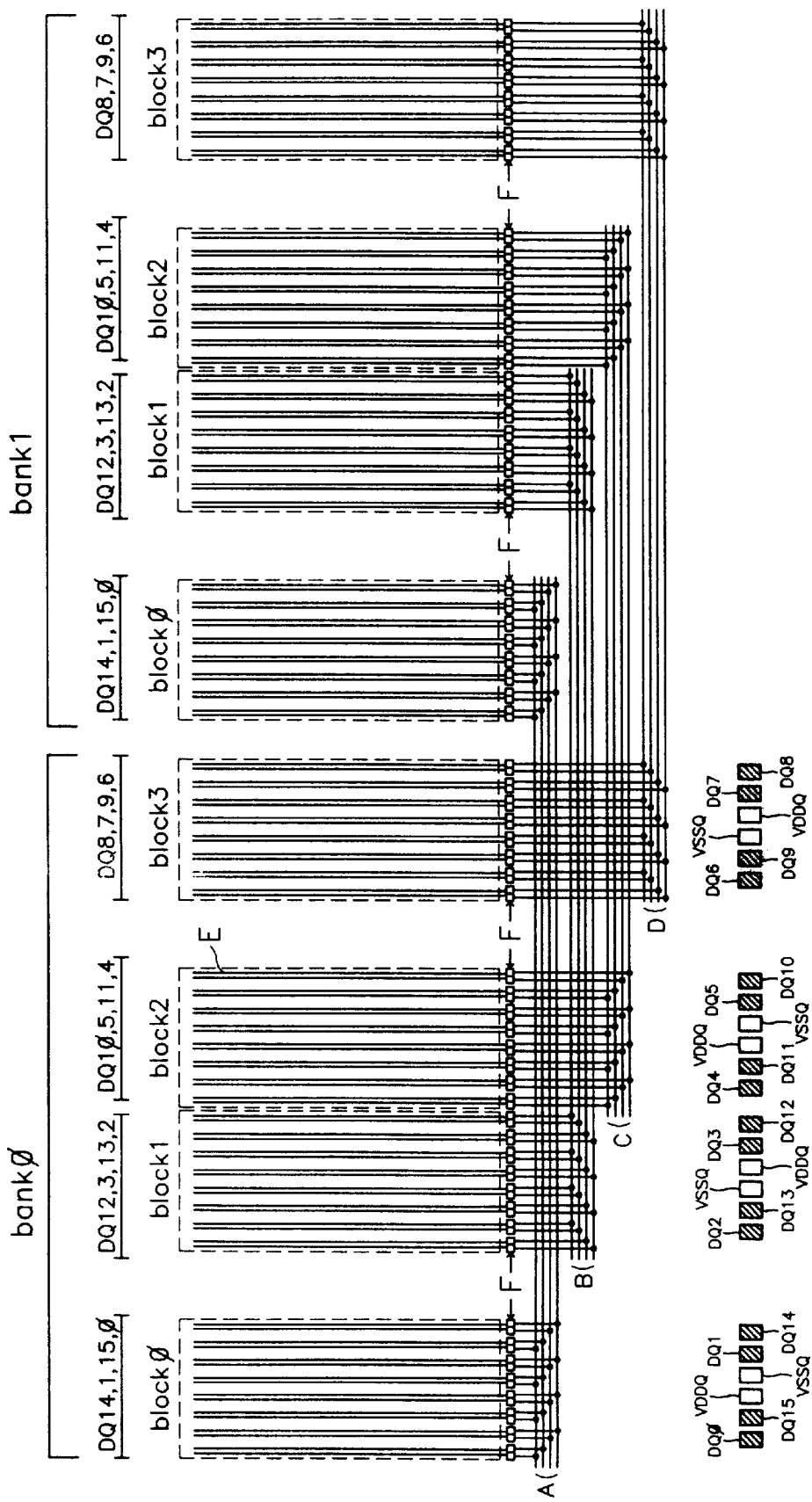

Referring to FIG. 3, the second embodiment of the present invention which is embodied in a 128M SDRAM is illustrated.

Although the 128M SDRAM actually comprises 4 banks and each bank contains 4 blocks therein, there are only 2 banks shown in FIG. 3. However, its disposition is generally identical to that of FIG. 2.

Similarly in FIG. 2, each of A, B, C and D in FIG. 3 represents data bus lines. The region represented by E shows local input/output(I/O) lines delivering data of memory cells which have been sensed from each block and amplified.

The region represented by F depicts circuits which amplify the data delivered through the local input/output (I/O) lines again and provide the amplified data to the data bus lines.

As illustrated in FIG. 3, the local I/O lines in each block have identical lengths to each other and each of them is connected to a data bus line having the same length as that of the local I/O line.

Further, since each data bus line interconnects blocks located in the same position in each bank, the lengths of the data bus lines are not only identical to each other but are also the shortest.

Therefore, the time delay between the data bus lines is minimized, and the skew between signals is also reduced to a minimum.

As shown above, the present invention can minimize the lengths of the data bus lines and reduce the time delay, which is the skew between signals and the current consumption, by uniformly disposing the data bus lines of the memory device to each block in each bank, wherein each bank contains a plurality of blocks therein.

While the present invention has been described with respect to the particular embodiments, it will be apparent to those skilled in the art that various changes and modifications may be made without departing from the spirit and scope of the invention as defined in the following claims.

What is claimed is:

1. A memory device having a first group to a fourth group of internal data pads being arranged according to a pin configuration of a package, comprising:

a first bank;

a second bank adjacent to the first bank;

a third bank facing with the first bank;

a fourth bank facing with the second bank; the first to fourth banks having a first to fourth block, respectively, and the position of blocks are the same in the respective banks;

a first to fourth sets of data bus lines downwardly arranged in turn from the first and second bank at an area between the first and the second bank and the third and the fourth bank;

the first set of data bus lines extended from the first block of the first bank to the first block of the second bank and arranged in order to share data input/output to/from the first block of the first to the fourth bank, respectively;

the second set of data bus lines extended from the second block of the first bank to the second block of the second bank and arranged in order to share data input/output to/from the second block of the first to the fourth bank, respectively;

the third set of data bus lines extended from the third block of the first bank to the third block of the second bank and arranged in order to share data input/output to/from the third block of the first to the fourth bank, respectively; and the fourth set of data bus lines extended from the fourth block of the first bank to the fourth block of the second bank and arranged in order to share data input/output to/from the fourth block of the first to the fourth bank, respectively.

2. The memory device as described in claim 1, wherein the lengths and widths of the first to the fourth sets of data bus lines are identical.

3. The memory device as described in claim 1, wherein the number of data to be inputted/outputted from each block of each bank is the same.

* * * * *